United States Patent

Yon (10) Patent No.: US 9,449,685 B2
(45) Date of Patent: Sep. 20, 2016

(54) RESISTANCE VARIABLE MEMORY APPARATUS, READ CIRCUIT UNIT AND OPERATION METHOD THEREFOR

(71) Applicant: SK hynix Inc., Icheon-si Gyeonggi-do (KR)

(72) Inventor: Sun Hyuck Yon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/661,085

(22) Filed: Mar. 18, 2015

(65) Prior Publication Data

US 2016/0141027 A1    May 19, 2016

(30) Foreign Application Priority Data

Nov. 13, 2014  (KR) .................. 10-2014-0158105

(51) Int. Cl.
*G11C 13/00* (2006.01)
*G11C 29/12* (2006.01)
*G11C 29/50* (2006.01)

(52) U.S. Cl.
CPC ....... *G11C 13/004* (2013.01); *G11C 29/12005* (2013.01); *G11C 29/50008* (2013.01); *G11C 2013/0054* (2013.01)

(58) Field of Classification Search
CPC .............................. G11C 13/004; G11C 29/08

USPC ......................................................... 365/148
See application file for complete search history.

(56) References Cited

U.S. PATENT DOCUMENTS

2003/0103395 A1*  6/2003  Ooishi ................... G11C 7/062
                                                                        365/201
2009/0257274 A1* 10/2009  Itagaki ................... G11C 11/16
                                                                        365/158

FOREIGN PATENT DOCUMENTS

KR    1020100079979 A     7/2010
KR    1020130088061 A     8/2013

* cited by examiner

*Primary Examiner* — Tha-O H Bui
*Assistant Examiner* — Alfredo Bermudez Lozada
(74) *Attorney, Agent, or Firm* — William Park & Associates Ltd.

(57) ABSTRACT

A resistance variable memory apparatus may include: a memory cell array; and a read circuit unit configured to receive a cell current, generate a digital code by repeating a cyclic analog-to-digital conversion (ADC) process a designated number of times, generate read data from the digital code, and output the generated read data during a normal read mode for the memory cell array, and to generate test data corresponding to the cell current and output the generated test data during a test read mode for the memory cell array.

17 Claims, 8 Drawing Sheets

| R_CELL | Data | R_CELL | Data | R_CELL | Data | R_CELL | Data | Ith |
|---|---|---|---|---|---|---|---|---|
| 175k | | 130k | | 85k | | 40k | | |
| 170k | | 125k | | 80k | | 35k | | |
| 165k | | 120k | | 75k | | 30k | | |
| 160k | | 115k | | 70k | | 25k | | |
| 155k | 11 | 110k | 10 | 65k | 01 | 20k | 00 | |
| 150k | | 105k | | 60k | | 15k | | |
| 145k | | 100k | | 55k | | 10k | | |
| 140k | | 95k | | 50k | | 5k | | |
| 135k | | 90k | | 45k | | 0k | | |

| Status | MSB_pre | D<1> | D<0> | TDATA |
|---|---|---|---|---|
| A | 1 | 1 | X | 11 |
| B | 1 | 0 | X | 10 |
| C | 0 | X | 1 | 01 |
| D | 0 | X | 0 | 00 |

FIG.8

| R_CELL | Data | R_CELL | Data | R_CELL | Data | R_CELL | Data | Ith |
|---|---|---|---|---|---|---|---|---|
| 175k |  | 130k |  | 85k |  | 40k |  |  |
| 170k |  | 125k |  | 80k |  | 35k |  |  |
| 165k | 11 | 120k |  | 75k |  | 30k |  |  |
| 160k |  | 115k | 10 | 70k |  | 25k |  |  |
| 155k |  | 110k |  | 65k | 01 | 20k | 00 |  |
| 150k |  | 105k |  | 60k |  | 15k |  |  |
| 145k |  | 1500k |  | 55k |  | 10k |  |  |
| 140k | 10 | 95k | 01 | 50k |  | 5k |  |  |
| 135k |  | 90k |  | 45k | 00 | 0k |  |  |

| Status | MSB_pre | D<1> | D<0> | TDATA |
|---|---|---|---|---|
| A | 1 | 1 | 1 | 11 |
| B | 1 | 0 | 1 | 10 |
| C | 1 | 0 | 0 | 01 |

| Status | MSB_pre | D<1> | D<0> | TDATA |
|---|---|---|---|---|
| C | 0 | X | 1 | 01 |
| D | 0 | X | 0 | 00 |

FIG.13

RESISTANCE VARIABLE MEMORY APPARATUS, READ CIRCUIT UNIT AND OPERATION METHOD THEREFOR

CROSS-REFERENCES TO RELATED APPLICATION

The present application claims priority under 35 U.S.C. §119(a) to Korean application number 10-2014-0158105, filed on Nov. 13, 2014, in the Korean Intellectual Property Office, which is incorporated herein by reference in its entirety.

BACKGROUND

1. Technical Field

Various embodiments relate to a semiconductor apparatus, and more particularly, to a resistance variable memory apparatus, a read circuit unit, and an operation method therefor.

2. Related Art

In a resistance variable memory device such as a phase change RAM (PRAM) or a resistance RAM (ReRAM), an information storage state is defined according to a resistance state of a data storage material.

During a write operation, the resistance variable memory device may apply a program current which can have a resistance state required by the data storage material. Furthermore, during a read operation, the resistance variable memory device may sense data stored in a memory cell by comparing a current value or voltage value corresponding to the amount of current flowing through the memory cell to a reference value.

The resistance of the data storage material forming the resistance variable memory device may be increased by various factors, and the increase in resistance of the data storage material may be referred to as a resistance drift.

The resistance drift determines a data retention time, and the data retention time serves as an important factor which determines the lifetime of the resistance variable memory device.

SUMMARY

In an embodiment, a resistance variable memory apparatus may include a memory cell array and a read circuit unit configured to receive a cell current, generate a digital code by repeating a cyclic analog-to-digital conversion (ADC) process a designated number of times, generate read data from the digital code, and output the generated read data during a normal read mode for the memory cell array. The read circuit unit may also be configured to generate test data corresponding to the cell current and output the generated test data during a test read mode for the memory cell array.

In an embodiment, a read circuit unit may include a sense amplifier configured to output a cell current corresponding to a resistance state of a memory cell. The read circuit may also include a data output unit configured to receive the cell current, generate a digital code by repeating a cyclic ADC process a designated number of times based on a preset normal reference voltage, and generate read data from the digital code during a normal read mode. The data output unit may also be configured to generate test data corresponding to the cell current based on a preset test reference voltage during a test read mode.

In an embodiment, an operation method for a resistance variable memory apparatus may include the step of generating a digital code by repeating a cyclic ADC process a designated number of times according to a cell current and a normal reference voltage, and generating read data from the digital code during a normal mode. The operation method may also include generating test data corresponding to the cell current according to the cell current and a test reference voltage during a test mode.

DETAILED DESCRIPTION

Hereinafter, a resistance variable memory apparatus, a read circuit unit, and an operation method according to the invention will be described below with reference to the accompanying figures through various embodiments.

Figure 1:
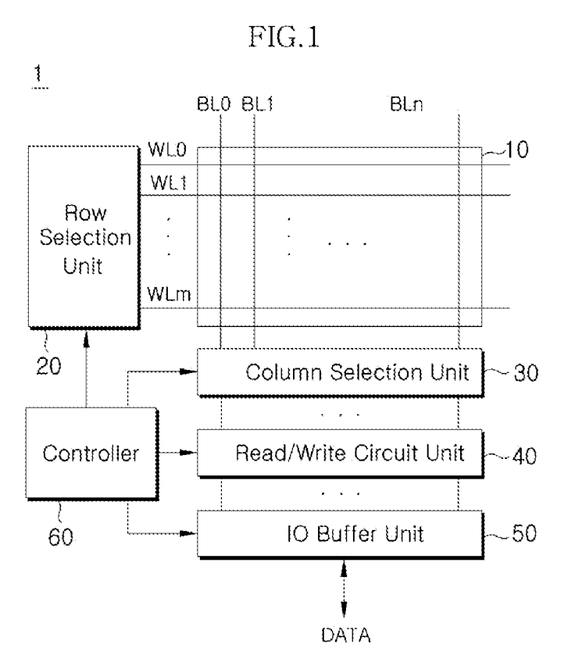
FIG. 1 is a configuration diagram of a resistance variable memory apparatus according to an embodiment.

Referring to FIG. 1, a configuration diagram of a resistance variable memory apparatus according to an embodiment is illustrated.

In FIG. 1, the resistance variable memory apparatus 1 according to an embodiment may include a memory cell array 10, a row selection unit 20, a column selection unit 30, a read/write circuit unit 40, an IO buffer unit 50, and a controller 60.

The memory cell array 10 may include a plurality of memory cells electrically coupled between a plurality of bit lines BL0 to BLn and a plurality of word lines WL0 to WLm. Each of the memory cells may be configured to include a selecting element and a data storage unit, but is not limited to such a configuration. Furthermore, the data storage unit may be formed of a resistance variable material.

The row selection unit 20 may decode a row address signal provided from outside. In addition, the row selection unit 20 may drive the decoded row address signal to the word lines WL0 to WLm. The column selection unit 30 may decode a column address signal provided from outside. Further, the column selection unit 30 may drive the bit lines BL0 to BLn according to an operation mode.

The read/write circuit unit 40 may include a read circuit unit 410 and a write circuit unit 420. During a read operation, the read/write circuit unit 40 may read data from a selected memory cell of the memory cell array 10 through the read circuit unit and output the read data. During a write operation, the read/write circuit unit 40 may write data to a selected memory cell through the write circuit unit.

The IO buffer unit 50 may receive data DATA from an outside source and provide the received data to the read/write circuit unit 40 during a write operation. Furthermore, the IO buffer unit 50 may receive data from the read/write circuit unit 40 and output the received data to the outside during a read operation.

The controller 60 may be configured to control the overall operations of the resistance variable memory apparatus 1.

In an embodiment, the read circuit unit included in the read/write circuit unit 40 of the semiconductor memory apparatus 1 may read a resistance value of a selected memory cell as a code. Further, the read circuit unit may convert the resistance value into data by encoding the resistance value, and output the data, during a normal read mode. Furthermore, during a test read mode, or desirably, during a test read mode at the wafer level, the read circuit unit included in the read/write circuit unit 40 may be configured to directly read resistance values of all memory cells as data.

The data storage material forming the resistance variable memory apparatus 1 may have resistance which increases with time. Such a resistance drift may serve as a factor that causes an operation fail during a read operation after data are written. To improve product reliability despite the resistance drift, a cyclic analog-to-digital conversion (ADC) scheme may be used. In a read method to which the cyclic ADC scheme is applied, a resistance value of a memory cell may be read as a code. Further, the read code may be encoded and converted into data.

However, when the cyclic ADC scheme is applied during a wafer level test, code values for all memory cells need to be stored one by one. Furthermore, the cycle ADC scheme requires logic for converting the code values of all memory cells into data. Furthermore, a code read from a memory cell needs to be flexibly matched with data.

In an embodiment, a resistance value of each memory cell is not read through the cyclic ADC scheme. In addition, logical data is directly determined from the resistance value of each memory cell, during a test mode. Thus, a circuit unit for storing the code values of all memory cells or logic for converting the code values into data is not necessary. Furthermore, a reference value may be provided to determine cell data in consideration of a drift state of a memory cell that makes it possible to flexibly handle a resistance drift of the memory cell.

Figure 2:
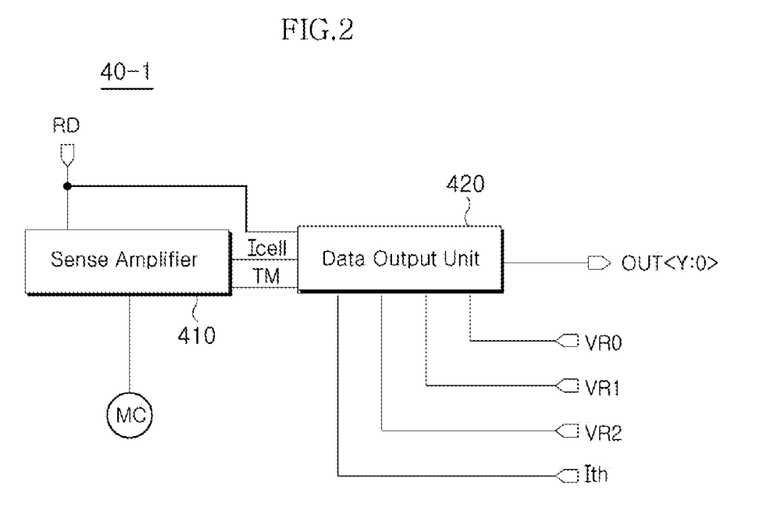
FIG. 2 is a configuration diagram of a read circuit unit according to an embodiment.

Referring to FIG. 2, a configuration diagram of the read circuit unit according to an embodiment is illustrated.

The read circuit unit 40-1 according to an embodiment may include a sense amplifier 410 and a data output unit 420.

The sense amplifier 410 may output a cell current Icell corresponding to cell data, or, a resistance state of a memory cell MC in response to a normal read command RD or test mode signal TM.

The data output unit 420 may receive the cell current Icell and generate a data output signal OUT<Y:0> according to the normal read command RD or the test mode signal TM.

When the normal read command RD is applied, the data output unit 420 may generate the data output signal OUT<Y:0> based on the cell current Icell, a threshold current Ith, and a normal reference voltage which can be internally generated by the data output unit 420. When the normal read command RD is applied, the data output unit 420 may generate a multi-bit digital code corresponding to the cell current Icell by performing cyclic ADC a designated number of times. Further, the data output unit 420 may generate the data output signal OUT<Y:0> by encoding the generated digital code. Thus, the data output signal OUT<Y:0> generated through the data output unit 420 may include read data RDATA<Y:0>.

When the test mode signal TM is applied, the data output unit 420 may generate the data output signal OUT<Y:0> based on the cell current Icell, the threshold current Ith, and test reference voltages VR0, VR1, and VR2 provided from a voltage generator (not illustrated). During the test mode TM, the data output unit 420 may be configured to directly generate the data output signal OUT<Y:0> corresponding to the cell current Icell. As a result, the data output signal OUT<Y:0> generated through the data output unit 420 may include test data TDATA<Y:0> corresponding to the cell current Icell based on a preset test reference voltage. The data output unit 420 may also generate the read data RDATA<Y:0> from the multi-bit digital code. The data output unit 420 may also repeat the cyclic ADC process described above.

Figure 3:
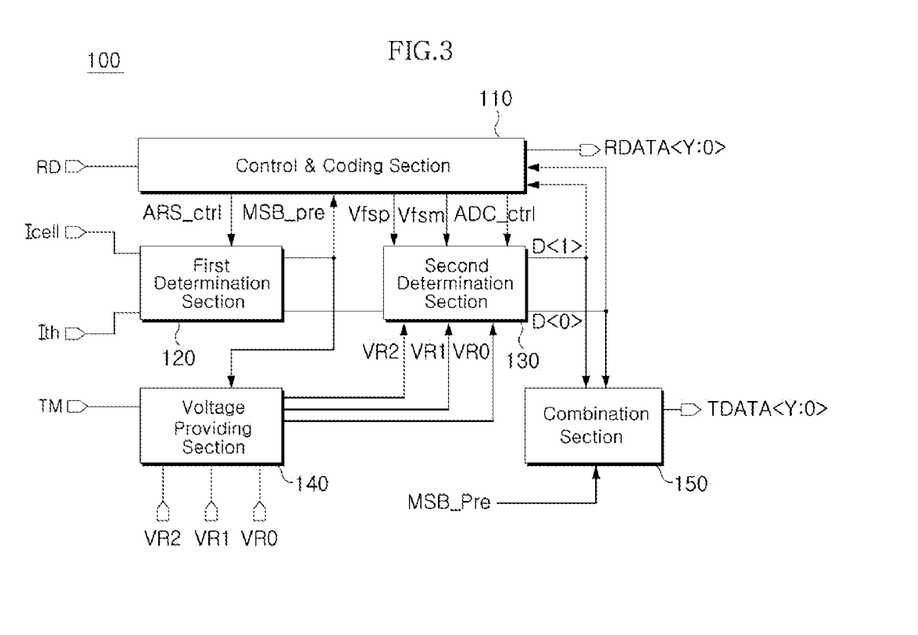
FIG. 3 is a configuration diagram of a data output unit according to an embodiment.

For this operation, the data output unit 420 may be configured as illustrated in FIG. 3.

Referring to FIG. 3, the data output unit 100 may include a control and coding section 110, a first determination section 120, a second determination section 130, a voltage providing section 140, and a combination section 150.

The control and coding section 110 may generate a first control signal ARS_ctrl during a read mode. In addition, the control and coding section 110 may generate a second control signal ADC_ctrl, a first normal reference voltage Vfsp, and a second normal reference voltage Vfsm according to the normal read command RD. Furthermore, the control and coding section 110 may generate a multi-bit digital code corresponding to the cell current Icell in response to a pre-MSB code MSB_pre provided from the first determination section 120 and multi-bit pre-sub codes D<1> and D<0> provided from the second determination section 130. Furthermore, the control and coding section 110 may generate the read data RDATA<Y:0> based on the generated digital code.

The first determination section 120 may generate the pre-MSB code MSB_pre based on a comparison result between the cell current Icell and the threshold current Ith in response to the first control signal ARS_ctrl. In addition, the first determination section 120 may drive the cell current Icell to the second determination section 130.

In an embodiment, the threshold current Ith may be provided as a current value corresponding to an intermediate resistance value (initial intermediate resistance value) of resistance values which a memory cell can have for each data level after data having the data level is initially written to the memory cell. Accordingly, the pre-MSB code MSB_pre outputted from the first determination section 120 may be outputted at a high level when the cell current Icell is larger than the threshold current Ith. In addition, the pre-MSB code MSB_pre may be outputted at a low level when the cell current Icell is smaller than the threshold current Ith. However, the embodiment is not limited thereto.

The second determination section 130 may generate the pre-sub codes D<1> and D<0> by comparing the cell current Icell to the first normal reference voltage Vfsp and the second normal reference voltage Vfsm according to the second control signal ADC_ctr provided from the control and coding section 110 during a normal read mode. The second determination section 130 may be implemented with an analog-to-digital converter (ADC). In addition, the process in which the second determination section 130 generates the pre-sub codes D<1> and D<0> may be repeated at a plurality of cycles.

The second determination section 130 may generate the pre-sub codes D<1> and D<0> by comparing the cell current Icell to the first to third test reference voltages VR0, VR1, and VR2, during the test mode. In particular, the second determination section 130 may generate the first pre-sub code D<1> by comparing the cell current Icell to any one of the first to third test reference voltages VR0, VR1, and VR2. In addition, the second determination section 130 may generate the second pre-sub code D<0> by comparing the cell current Icell to another of the first to third test reference voltages VR0, VR1, and VR2.

The voltage providing section 140 may be driven in response to the test mode signal TM. Further, the voltage providing section 140 may receive the first to third test reference voltages VR0, VR1, and VR2 from the voltage generator. Furthermore, the voltage providing section 140 may provide a test reference voltage selected from the first to third test reference voltages VR0, VR1, and VR2 to the second determination section 130, according to the level of the pre-MSB code MSB_pre.

The combination section 150 may receive the pre-MSB code MSB_pre from the first determination section 120, receive the pre-sub codes D<1> and D<0> from the second determination section 130, and output the test data TDATA<Y:0> corresponding to the cell current Icell.

In an embodiment, the levels of the first to third test reference voltages VR0, VR1, and VR2 may be determined by reflecting the extent of resistance drift of the data storage material forming a memory cell. For this operation, the respective levels of the first to third test reference voltages VR0, VR1, and VR2 may be arithmetically operated and estimated according to the resistance drift of the variable resistance material adopted as the data storage material. In an embodiment, resistance drifts for a plurality of sample memory cells may be measured before a test. In addition, the respective levels of the first to third test reference voltages VR0, VR1, and VR2 may be determined on the basis of the measured resistance drifts. At this time, the sample memory cells may include a plurality of reference memory cells provided separately from main memory cells for actually storing data, or a plurality of memory cells selected from the main memory cells for actually storing data.

More specifically, the first to third test reference voltages VR0, VR1, and VR2 may be determined by reflecting the extent of resistance drift of a memory cell during the test mode. Furthermore, as the voltage value corresponding to the cell current Icell is compared to a reference voltage selected from the first to third test reference voltages VR0, VR1, and VR2 during the test mode, the test data TDATA<Y:0> corresponding to the resistance value of each of all memory cells may be directly outputted.

Figure 4:
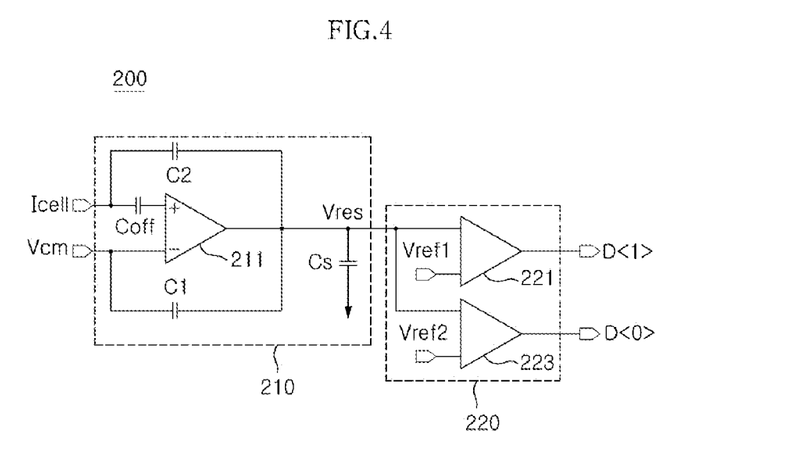
FIG. 4 is a configuration diagram of a second determination section according to an embodiment.

Referring to FIG. 4, a configuration diagram of the second determination section according to an embodiment is illustrated.

The second determination section 200 according to an embodiment may include a voltage converter 210 and a comparator 220.

The voltage converter 210 may receive the cell current Icell and a voltage conversion reference value Vcm. The voltage converter 210 may also output a voltage signal Vres.

The comparator 220 may compare the voltage signal Vres to first and second reference voltages Vref1 and Vref2. The comparator 220 may also generate the multi-bit pre-sub codes D<1> and D<0>, respectively.

In an embodiment, the voltage converter 210 may include an operational trans-conductance amplifier 211 to generate the voltage signal Vres based on the cell current Icell and the voltage conversion reference value Vcm, but is not limited thereto. FIG. 4 also illustrates Capacitors Coff, C1, and C2.

In an embodiment, the comparator 220 may include a first comparison section 221 and a second comparison section 223. The first comparison section 221 may generate the first pre-sub code D<1> by comparing the voltage signal Vres to the first reference voltage Vref1. In addition, the second comparison section 223 may generate the second pre-sub code D<0> by comparing the voltage signal Vres to the second reference voltage Vref2.

During a normal read operation, the first and second reference voltages Vref1 and Vref2 may include the first and second normal reference voltages Vfsp and Vfsm provided from the control and coding section 110.

During the test mode, the first and second reference voltages Vref1 and Vref2 may be determined according to the resistance drift state of a memory cell and the level of the pre-MSB code MSB_pre.

For example, when the extent of resistance drift of a memory cell is low during the test mode, the level of the threshold current Ith, or, a current value corresponding to the initial intermediate resistance value of the memory cell may be provided as a current value corresponding to actual intermediate resistance of the memory cell. In this case, a low resistance state (data 00 or 01) and a high resistance state (data 10 or 11) may be distinguished according to the pre-MSB code MSB_pre. Furthermore, the voltage providing section 140 may provide the third test reference voltage VR2 set at a level for distinguishing data of memory cells having the high resistance state (data 10 or 11), as the first reference voltage Vref1. In addition, the voltage providing section 140 may provide the first test reference voltage VR0, set at a level for distinguishing data of memory cells having the low resistance state (data 00 or 01), as the second reference voltage Vref2.

On the other hand, when the extent of resistance drift of the memory cell is high during the test mode, the threshold current Ith corresponding to the initial intermediate resistance of the memory cell may have a level different from the current value corresponding to the actual intermediate resistance of the memory cell, for example, a low level. In this instance, the low resistance state (data 00 or 01) and the high resistance state (data 10 or 11) cannot be distinguished from each other according to the pre-MSB code MSB_pre.

Accordingly, when the pre-MSB code MSB_pre is at a high level, the voltage providing section 140 may provide the third test reference voltage VR2, set at a level for distinguishing the high resistance state (data 10 or 11), as the first reference voltage Vref1. In addition, the voltage providing section 140 may provide the second test reference voltage VR1, set at a level for distinguishing the low resistance state (data 01), as the second reference voltage Vref2. On the other hand, when the pre-MSB code MSB_pre is at a low level, the voltage providing section 140 may provide the second test reference voltage VR2, set at a level for distinguishing the low resistance state (data 00 or 01), as the second reference voltage Vref2, and also apply the first test reference voltage Vref1 in a default state. Levels of the first test reference voltage VR0 and the second test reference voltage VR1 may best according to a level of the pre-MSB code MSB_pre based on the threshold current Ith.

Referring to FIGS. 5 to 7B, diagrams for explaining a test read method according to an embodiment are illustrated.

Figure 5:
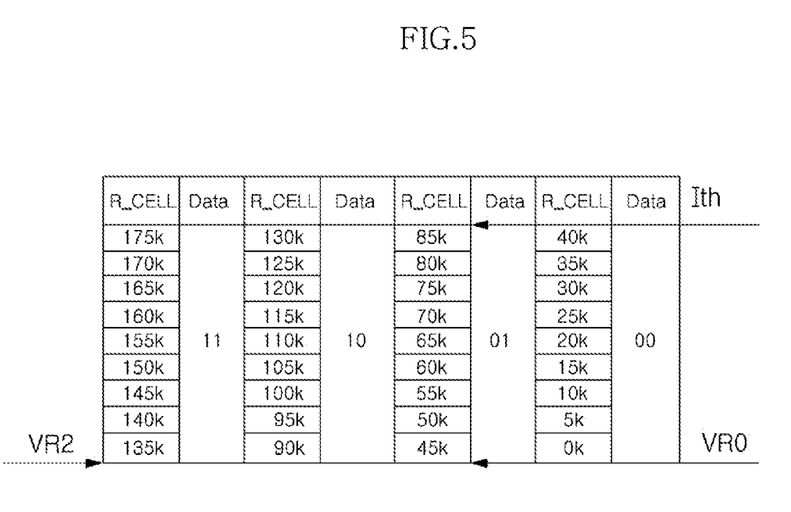
FIG. 5 is a diagram for explaining a test read method according to an embodiment.

In FIG. 5, suppose that the extent of resistance drift of a memory cell is low and cell resistances R_CELL have a distribution of 0 to 175 kΩ during the test mode. Furthermore, suppose that the level of the threshold current Ith corresponding to the initial intermediate resistance of the memory cell is provided as a current value corresponding to an actual intermediate resistance (about 85 kΩ) of the memory cell. In this instance, the low resistance state (data 00 or 01) and the high resistance state (data 10 or 11) can be distinguished according to the pre-MSB code MSB_pre.

Referring again to FIG. 3, when the low-resistance state (data 00 or 01) and the high-resistance state (data 10 or 11) can be distinguished according to the pre-MSB code MSB_pre, the voltage providing section 140 may provide the third test reference voltage VR2, set at a level for distinguishing data of memory cells having the high resistance state (data 10 or 11), as the first reference voltage Vref1. In addition, the voltage providing section 140 may provide the first test reference voltage VR0, set at a level for distinguishing data of memory cells having the low resistance state (data 00 or 01), as the second reference voltage Vref2.

Furthermore, the first determination section 120 of FIG. 3 may output the pre-MSB code MSB_pre at a high level, when the cell current Icell is larger than the threshold current Ith. Thus, the first comparison section 221 of the comparator 220 illustrated in FIG. 6 may compare the voltage signal Vres generated from the voltage converter 210 to the third test reference voltage VR2. In addition, the comparison result between the voltage signal Vres and the first test reference voltage VR0 corresponding to the second reference voltage Vref2 may be ignored.

When the cell current Icell is smaller than the threshold current Ith, the first determination section 120 of FIG. 3 may output the pre-MSB code MSB_pre at a low level. Thus, the second comparison section 223 of the comparator 220 illustrated in FIG. 6 may compare the voltage signal Vres generated from the voltage converter 210 to the first test reference voltage VR0. Further, the comparison result between the voltage signal Vres and the third test reference voltage VR2 corresponding to the first reference voltage Vref1 may be ignored.

Figure 7A:
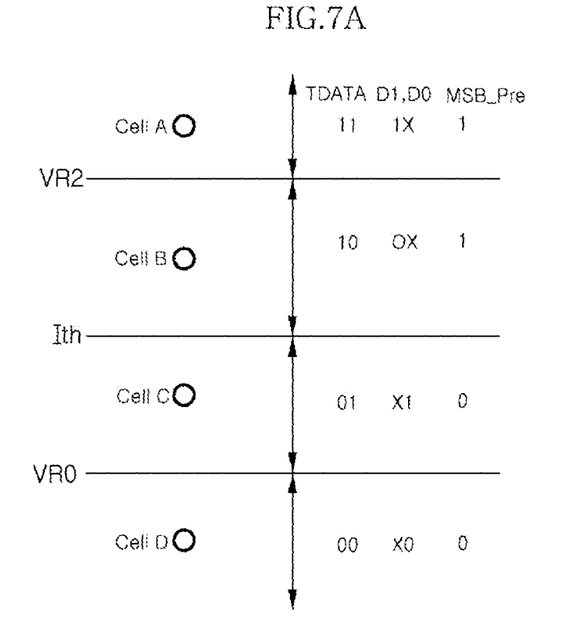
FIG. 7A is a diagram for explaining a test read method according to an embodiment.
Figure 7B:
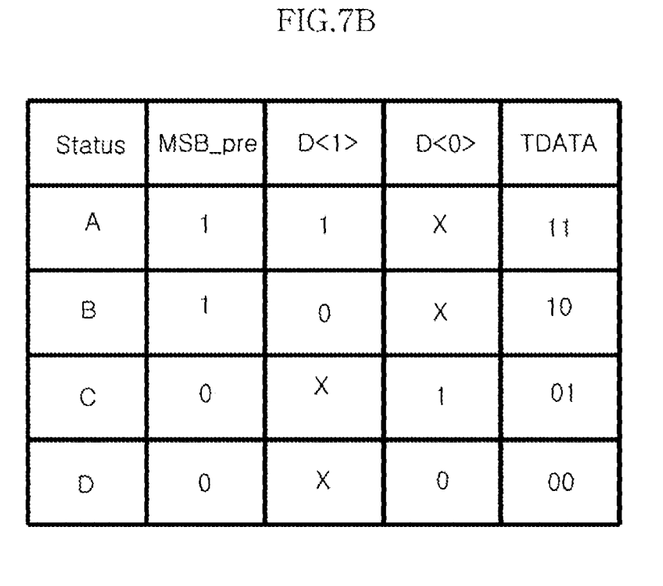
FIG. 7B is a diagram for explaining a test read method according to an embodiment.

FIGS. 7A and 7B illustrate the levels of the pre-MSB code MSB_pre and the pre-sub codes D<1> and D<0> based on the cell resistance state in this case and the test data TDATA<Y:0> outputted according to the levels. FIG. 7B also illustrates a Status.

Referring to FIGS. 8 to 12B, diagrams for explaining a test read method according to an embodiment are illustrated.

Figure 8:
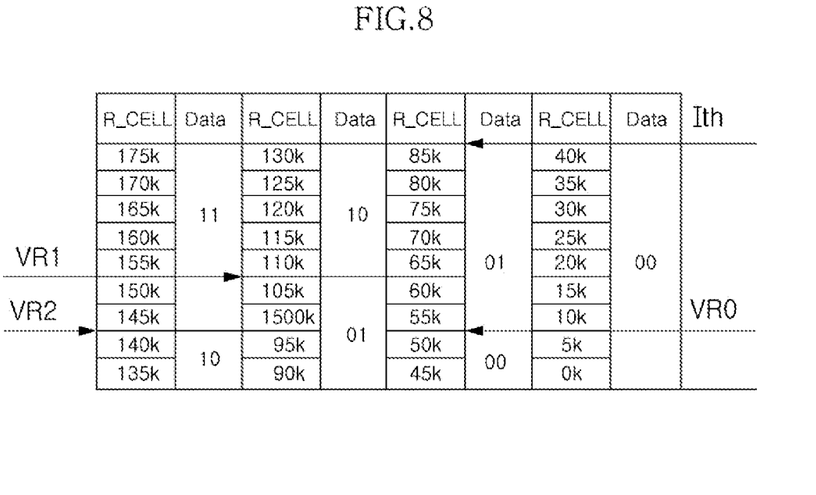
FIG. 8 is a diagram for explaining a test read method according to an embodiment.

In an embodiment, suppose that the extent of resistance drift of a memory cell is high and cell resistances have a distribution of 0 to 175 kΩ, during a test mode. Furthermore, suppose that the level of the threshold current Ith corresponding to the initial intermediate resistance of the memory cell is provided as a current value having a different level from a current value corresponding to an actual intermediate resistance of the memory cell, for example, a low level. In this case, the low resistance state (data 00 or 01) and the high resistance state (data 10 or 11) cannot be distinguished according to the pre-MSB code MSB_pre.

Referring once more to FIG. 3, the operation in this case will be described.

First, when the cell current Icell is larger than the threshold current Ith, the first determination section 120 may output the pre-MSB code MSB_pre at a high level. In this case, the voltage providing section 140 may provide the third test reference voltage VR2, set at a level for distinguishing the high resistance state (data 10 or 11), as the first reference voltage Vref1. Further, the voltage providing section 140 may provide the second test reference voltage VR1, set at a level for distinguishing the low resistance state (data 01), as the second reference voltage Vref2.

Figure 6:
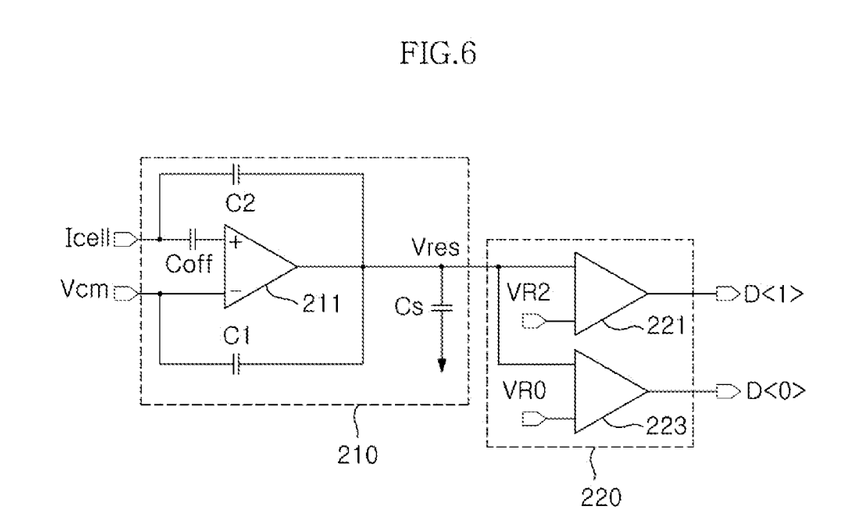
FIG. 6 is a diagram for explaining a test read method according to an embodiment.
Figure 9:
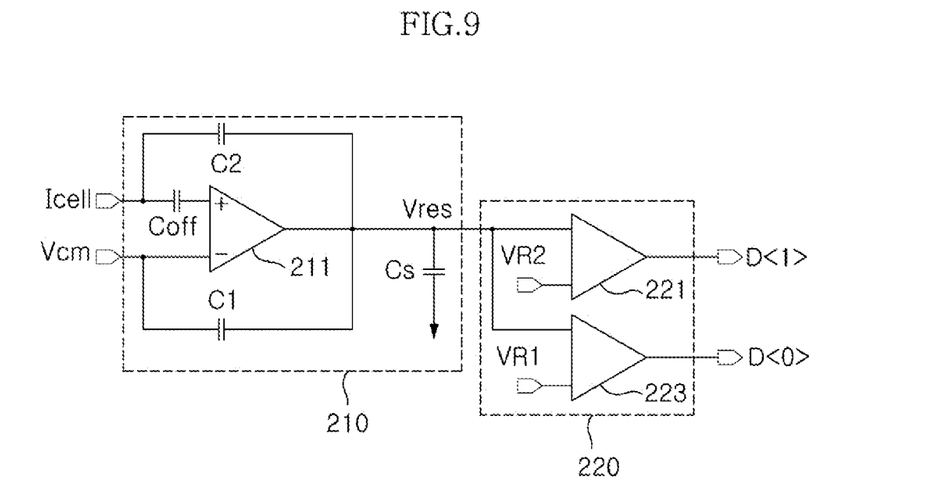
FIG. 9 is a diagram for explaining a test read method according to an embodiment.

Thus, the first comparison section 221 of the comparator 220 illustrated in FIG. 9 may compare the voltage signal Vres generated from the voltage converter 210 to the third test reference voltage VR2. In addition, the second comparison section 223 may compare the voltage signal Vres to the second test reference voltage VR1. FIG. 9 also illustrates a capacitor Cs that is also illustrated in FIGS. 4 and 6.

Figure 10A:
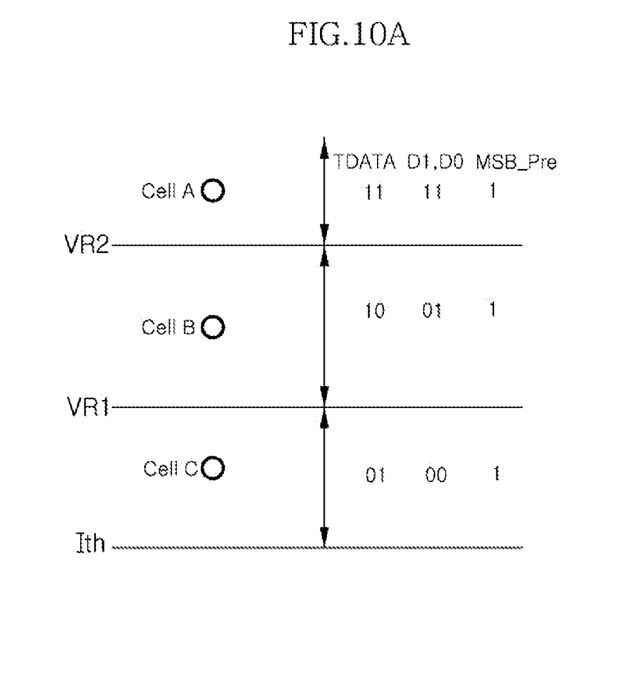
FIG. 10A is a diagram for explaining a test read method according to an embodiment.
Figure 10B:
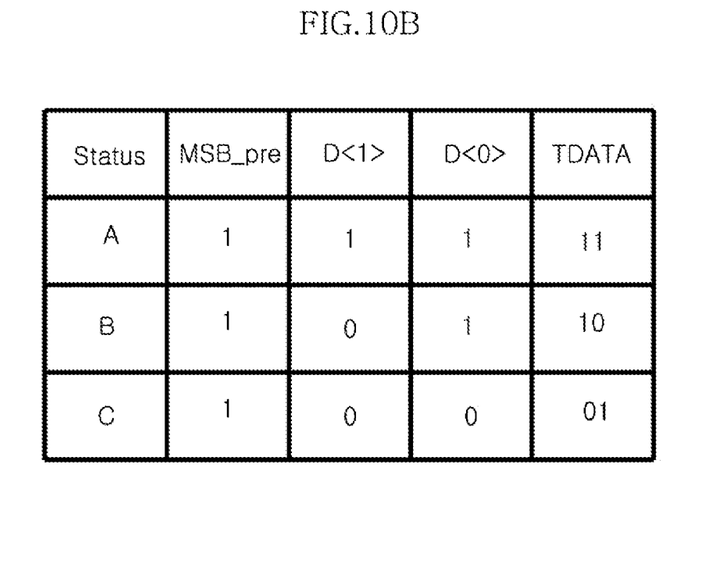
FIG. 10B is a diagram for explaining a test read method according to an embodiment.

FIGS. 10A and 10B illustrate the levels of the pre-MSB code MSB_pre and the pre-sub codes D<1> and D<0> based on the cell resistance state in this case and the test data TDATA<Y:0> outputted according to the levels. FIG. 10A and FIG. 7A also illustrate Cell A, Cell B and Cell C.

Figure 11:
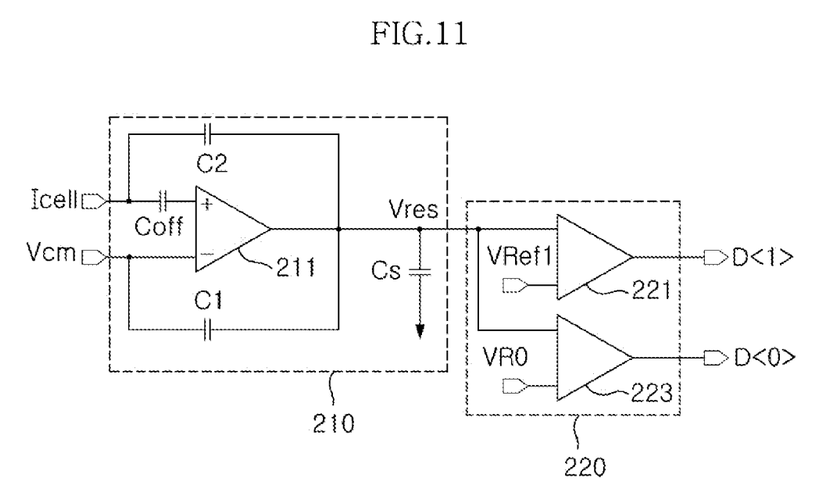
FIG. 11 is a diagram for explaining a test read method according to an embodiment.

On the other hand, when the cell current Icell is smaller than the threshold current Ith, the first determination section 120 of FIG. 3 may output the pre-MSB code MSB_pre at a low level. In this instance, the voltage providing section 140 may provide the first test reference voltage VR0, set at a level for distinguishing data of memory cells having the low-resistance state (data 00 or 01), as the second reference voltage Vref2. Accordingly, as illustrated in FIG. 11, the second comparison section 223 of the comparator 220 may compare the voltage signal Vres generated from the voltage converter 210 to the first test reference voltage VR0. At this time, the comparison result between the first reference voltage Vref1 and the voltage signal Vres may be ignored.

Figure 12A:
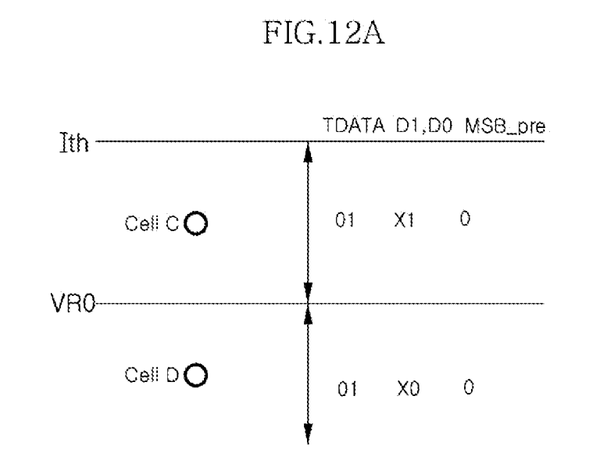
FIG. 12A is a diagram for explaining a test read method according to an embodiment.
Figure 12B:
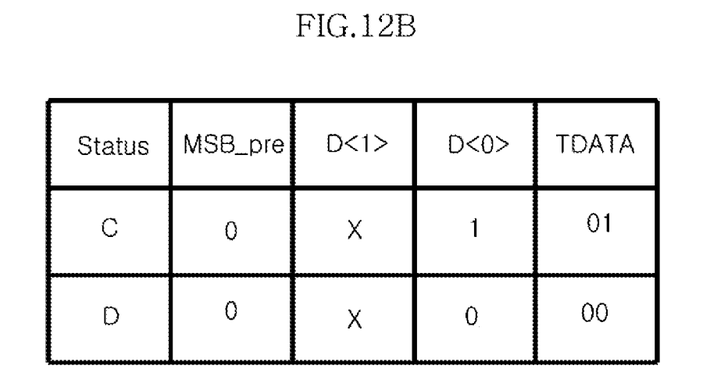
FIG. 12B is a diagram for explaining a test read method according to an embodiment.

FIGS. 12A and 12B illustrate the levels of the pre-MSB code MSB_pre and the pre-sub codes D<1> and D<0> based on the cell resistance state in this case and the test data TDATA<Y:0> outputted according to the levels. FIG. 12A also illustrates a Cell C and a Cell D.

As such, during the test mode, the resistance values of all memory cells may be directly read as data without performing the cyclic ADC scheme multiple times. Then, a repair operation or the like may be performed according to the read data.

Figure 13:
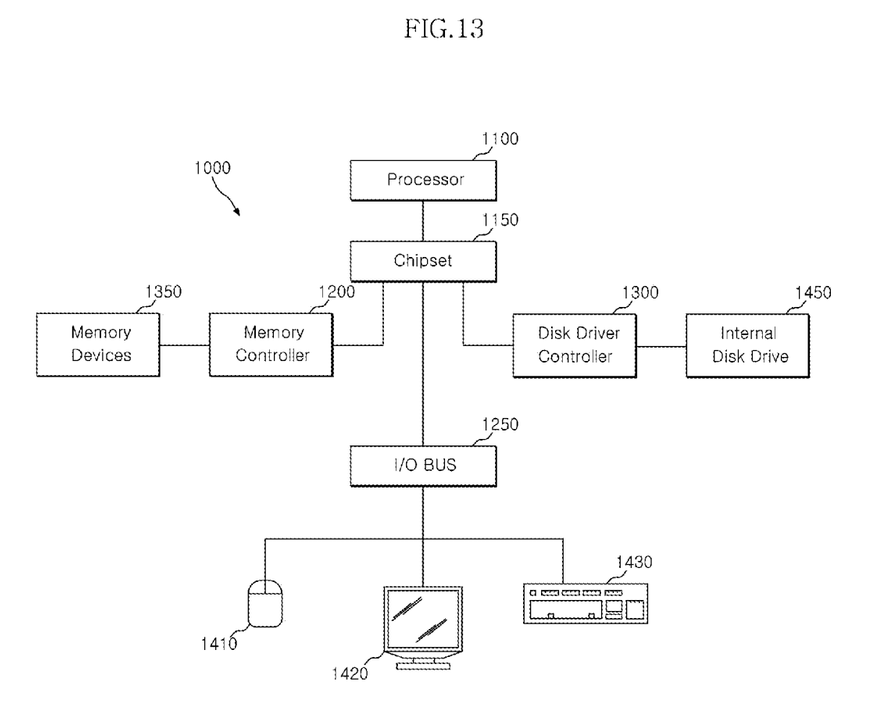
FIG. 13 illustrates a block diagram of a system employing a memory controller circuit in accordance with an embodiment.

A system 1000 may include one or more processors 1100. The processor 1100 may be used individually or in combination with other processors. A chipset 1150 may be electrically coupled to the processor 1100. The chipset 1150 is a communication pathway for signals between the processor 110 and other components of the system 1000. Other components may include a memory controller 1200, an input/output ("I/O") bus 1250, and a disk drive controller 1300. Depending on the configuration of the system, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the resistance variable memory apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of examples only. Accordingly, the semiconductor apparatus described should not be limited based on the described embodiments. Rather, the semiconductor apparatus described should only be limited in light of the claims that follow when taken in conjunction with the above description and accompanying figures.

What is claimed is:

1. A resistance variable memory apparatus comprising:
   a memory cell array; and
   a read circuit unit configured to receive a cell current, generate a digital code by repeating a cyclic analog-to-digital conversion (ADC) process a designated number of times, generate read data from the digital code, and output the generated read data during a normal read mode for the memory cell array, and to generate test data corresponding to the cell current and output the generated test data during a test read mode for the memory cell array,
   wherein the read circuit unit comprises a data output unit including:
   a first determination section configured to generate a pre-MSB (most significant bit) code based on a comparison result between the cell current and a threshold current;
   a second determination section configured to generate a test-mode pre-sub code by comparing the cell current to a preset test reference voltage during the test read mode; and
   a combination section configured to receive the pre-MSB code and the test-mode pre-sub code and generate the test data during the test read mode.

2. The resistance variable memory apparatus according to claim 1, wherein the read circuit unit comprises:
   a sense amplifier configured to output the cell current corresponding to a resistance state of a memory cell; and
   the data output unit configured to receive the cell current and the threshold current, generate the digital code by repeating the cyclic ADC process the designated number of times based on a preset normal reference voltage, and generate the read data from the digital code during the normal read mode, and to generate the test data corresponding to the cell current based on the test reference voltage during the test read mode.

3. The resistance variable memory apparatus according to claim 1, wherein the second determination section repeats the cyclic ADC process the designated number of times during the normal read mode, the cyclic ADC process including generating a normal-mode pre-sub code by comparing the cell current to the normal reference voltage, and
   the data output unit further comprises a control and coding section configured to generate the digital code corresponding to the cell current and generate the read data based on the digital code, in response to the pre-MSB code provided from the first determination section and the normal-mode pre-sub code provided from the second determination section during the normal read mode.

4. The resistance variable memory apparatus according to claim 1, wherein the second determination section comprises:
   a voltage converter configured to receive the cell current and a voltage conversion reference value and output a voltage signal; and
   a comparator configured to compare the voltage signal to the test reference voltage and generate the test-mode pre-sub code.

5. The resistance variable memory apparatus according to claim 4, wherein the comparator comprises:
   a first comparison section configured to compare the voltage signal to a first test reference voltage and generate a first test-mode pre-sub code; and
   a second comparison section configured to compare the voltage signal to a second test reference voltage and generate a second test-mode pre-sub code.

6. The resistance variable memory apparatus according to claim 5, wherein levels of the first and second test reference voltages are set according to a level of the pre-MSB code based on the threshold current.

7. The resistance variable memory apparatus according to claim 6, wherein when the resistance state of the memory cell is divided into a high resistance state and a low resistance state according to the level of the threshold current, the first test reference voltage is provided as a level for distinguishing data of memory cells in the high resistance state, and the second test reference voltage is provided as a level for distinguishing data of memory cells in the low resistance state.

8. The resistance variable memory apparatus according to claim 6, wherein when the resistance state of the memory cell cannot be divided into a high resistance state and a low resistance state according to the level of the threshold current, the first test reference voltage is provided as a level for distinguishing data of memory cells in the high resistance state and the low resistance state, and the second test reference voltage is provided as a level for distinguishing data of memory cells in the low resistance state.

9. A read circuit unit comprising:
   a sense amplifier configured to output a cell current corresponding to a resistance state of a memory cell; and
   a data output unit configured to receive the cell current, generate a digital code by repeating a cyclic analog-to-digital conversion ADC process a designated number of times based on a preset normal reference voltage, and generate read data from the digital code during a normal read mode, and to generate test data corresponding to the cell current based on a preset test reference voltage during a test read mode,
   wherein the data output unit comprises:
   a first determination section configured to generate a pre-MSB (most significant bit) code based on a comparison result between the cell current and a threshold current;

a second determination section configured to generate a test-mode pre-sub code by comparing the cell current to the test reference voltage during the test read mode; and a combination section configured to receive the pre-MSB code and the test-mode pre-sub code and generate the test data during the test read mode.

10. The read circuit unit according to claim 9, wherein the second determination section repeats the cyclic ADC process the designated number of times during the normal read mode, the cyclic ADC process including generating a normal-mode pre-sub code by comparing the cell current to the normal reference voltage, and the data output unit further comprises a control and coding section configured to generate the digital code corresponding to the cell current and generate the read data based on the digital code in response to the pre-MSB code provided from the first determination section and the normal-mode pre-sub code provided from the second determination section during the normal read mode.

11. The read circuit unit according to claim 9, wherein the second determination section comprises:

a voltage converter configured to receive the cell current and a voltage conversion reference value and output a voltage signal; and a comparator configured to compare the voltage signal to the test reference voltage and generate the test-mode pre-sub code.

12. The read circuit unit according to claim 11, wherein the comparator comprises:

a first comparison section configured to compare the voltage signal to a first test reference voltage and generate a first test-mode pre-sub code; and a second comparison section configured to compare the voltage signal to a second test reference voltage and generate a second test-mode pre-sub code.

13. The read circuit unit according to claim 12, wherein levels of the first and second test reference voltages are set according to a level of the pre-MSB code based on the threshold current.

14. The read circuit unit according to claim 13, wherein when resistance the state of the memory cell is divided into a high resistance state and a low resistance state according to a level of the threshold current, the first test reference voltage is provided as a level for distinguishing data of memory cells in the high resistance state, and the second test reference voltage is provided as a level for distinguishing data of memory cells in the low resistance state.

15. The read circuit unit according to claim 13, wherein when the resistance state of the memory cell cannot be divided into a high resistance state and a low resistance state according to the level of the threshold current, the first test reference voltage is provided as a level for distinguishing data of memory cells in the high resistance state and the low resistance state, and the second test reference voltage is provided as a level for distinguishing data of memory cells in the low resistance state.

16. An operation method for a resistance variable memory apparatus, comprising the steps of:

generating a digital code by repeating a cyclic analog-to-digital conversion ADC process a designated number of times according to a cell current and a normal reference voltage, and generating read data from the digital code during a normal mode; and generating test data corresponding to the cell current according to the cell current and a test reference voltage during a test mode, wherein the step of generating the test data comprises the steps of:

generating a pre-MSB (most significant bit) code according to a comparison result between the cell current and a threshold current;

generating a test-mode pre-sub code by comparing the cell current to the test reference voltage; and receiving the pre-MSB code and the test-mode pre-sub code and generating the test data.

17. The operation method according to claim 16, wherein a level of the test reference voltage is set according to a level of the pre-MSB code based on the threshold current.

* * * * *